United States Patent [19]
Boctor

[11] 3,946,328
[45] Mar. 23, 1976

[54] FUNCTIONALLY TUNABLE ACTIVE FILTER

[75] Inventor: Stalin A. Boctor, Agincourt, Canada

[73] Assignee: Northern Electric Company, Limited, Montreal, Canada

[22] Filed: Jan. 27, 1975

[21] Appl. No.: 544,433

[52] U.S. Cl. ................. 330/107; 328/167; 330/109
[51] Int. Cl.² ......................................... H03K 9/04
[58] Field of Search ............. 328/167; 330/107, 109

[56] References Cited
UNITED STATES PATENTS
3,805,178  4/1974  Rollett .................................. 330/107
3,838,351  9/1974  Hekimian ......................... 330/107 X OTHER PUBLICATIONS
D. G. Hurel and P. Austruy, "Active Band Pass Filter," IBM Technical Disclosure Bulletin, p. 491, Oct. 1968.

Primary Examiner—R. V. Rolinec
Assistant Examiner—Lawrence J. Dahl
Attorney, Agent, or Firm—John E. Mowle

[57] ABSTRACT

A family of RC active filters in which band-pass, low-pass notch, high-pass notch, band-stop and all-pass second order sections may be realized. The filters provide unidirectional functional tuning of the four basic parameters $\omega_o$, $Q_o$, $\omega_z$ and $Q_z$ through resistive trimming.

10 Claims, 8 Drawing Figures

BAND-PASS FILTER

LOW-PASS NOTCH FILTER

HIGH-PASS NOTCH FILTER

BAND-STOP FILTER

ALL-PASS FILTER

FUNCTIONALLY TUNABLE ACTIVE FILTER

This invention relates to a family of second-order active filters and more particularly to one which allows a unidirectional sequence of functional tuning of resonant frequencies and quality factors by varying only resistors.

BACKGROUND OF THE INVENTION

Resistive-capacitive (RC) active filters provide an economical arrangement for controlling the transmission of signals. These filters are almost always realized as a cascade of second-order sections for sensitivity and tuning considerations. T.Deliyannis in an article entitled: "High-Q Factor Circuit with Reduced Sensitivity", Electronics Letters, 1968, 4 No. 26, pp 577–579; describes an RC-active filter which uses a single differential-input operational amplifier that is suitable for realizing high-Q factor second-order band-pass functions. In a later article by the same author entitled: "RC Active Allpass Sections", Electronics Letters, 1969, 5, pp 59–60; and errata: Electronics Letters, 1969, 5, p 128; there is described two networks which realize a second-order all-pass function. Evolution of these simple negative feedback sections by J. J. Friend in a paper entitled: "A Single Operational Amplifier Biquadratic Filter Section", 1970 IEEE International Symposium Circuit Theory (Atlanta, Ga.) Dec. 14, 1970, pp 179–180; resulted in the realization of band-pass, low-pass, high-pass, band-stop and all-pass second order sections.

In constructing such filters utilizing either thin or thick film techniques, it is usually necessary to employ laser, abrasive or anodization trimming of the resistive components to achieve the final functional parameters of the filter. Consequently, it is advantageous to be able to use a unidirectional tuning sequence by trimming only resistors. If the trimming elements are all interdependent as is the case with Friend's circuits, it will be necessary to utilize nominal capacitors of very tight tolerance and then to individually trim each resistor to its nominal value in a series of ever-decreasing steps in order not to overtrim; or to measure the capacitive values and then utilize a computer to calculate the desired values of the resistors assuming a nominal operational amplifier characteristic prior to trimming each individual filter. This involves the added complication of having to provide test points in the integrated circuit for measuring the resistors and capacitors, and also of connecting the components back into the circuit once the measurements are made. Thus, RC-active filters of the type described by Friend above, do not permit functional tuning simply by trimming the resistive components in a predetermined sequence while monitoring the overall magnitude and/or phase of the filter. While active filter circuits which provide unidirectional functional tuning have been developed by others in the past, in general they do not have the structural simplicity or the low sensitivity of the above-mentioned circuits.

SUMMARY OF THE INVENTION

The present invention combines the advantages of Deliyannis' and Friend's circuits with that of unidirectional functional tuning by providing a family of RC-active filters in which the four basic parameters $\omega_o$, $Q_o$, $\omega_z$, and $Q_z$ can be adjusted in a unidirectional sequence through resistive trimming.

Thus, in the basic form of the invention, there is provided a functionally tunable active filter comprising a differential amplifier; a first capacitor and a first resistor serially connected between the input of the filter and the inverting input of the amplifier. Additionally, a second capacitor is connected between the inverting input and the output of the amplifier, a second resistor is connected between the junction of the first capacitor and resistor and a common terminal of the filter. Also, a third resistor is connected between the above said junction and the output of the differential amplifier while the non-inverting input of the amplifier is connected to the common terminal. The structure is such that variations in the resistance of the first and/or third resistors affect the pole resonant frequency $\omega_o$, while variations in resistance of the second resistor affect the pole quality factor $Q_o$ but not $\omega_o$, thereby producing a unidirectional sequence of functional tuning of a band-pass filter.

By modifying the basic band-pass section, it can be made to function as a low-pass notch. Instead of a direct connection to ground, a fourth resistor is connected between the non-inverting input of the amplifier and the common terminal. In addition, a fifth resistor is connected between the non-inverting input and the input of the filter while a sixth resistor is connected between the inverting input and the common terminal. In addition to the above parameters, variations in resistance of the sixth resistor affect the zero resonant frequency $\omega_z$ but not $\omega_o$ and $Q_o$, while variations in resistance of the fourth and/or fifth resistors affect the zero quality factor $Q_z$ but not $\omega_o$, $\omega_z$ and $Q_o$, again enabling a unidirectional sequence of functional tuning.

By connecting a third capacitor in shunt with the sixth resistor, and altering the component values, the low-pass notch section described above will function as a high-pass notch filter, a band-stop filter or an all-pass filter while retaining the unidirectional sequence of functional tuning of the four basic parameters $\omega_o$, $Q_o$, $\omega_z$ and $Q_z$. Thus, if the element values are such that $\omega_z$ is less than $\omega_o$ and $Q_z = \infty$, the circuit functions as a high-pass notch filter. Alternatively, if the element values are such that $\omega_z = \omega_o$ and $Q_z = -Q_o$ the circuit functions as an all-pass filter. While, if the values are such that $\omega_z = \omega_o$ and $Q_z = \infty$, the circuit functions as a band-stop filter.

BRIEF DESCRIPTION OF THE DRAWINGS

Example embodiments of the invention will now be described with reference to the accompanying drawings in which.

DESCRIPTION OF THE PREFERRED EMBODIMENTS

Figure 1:
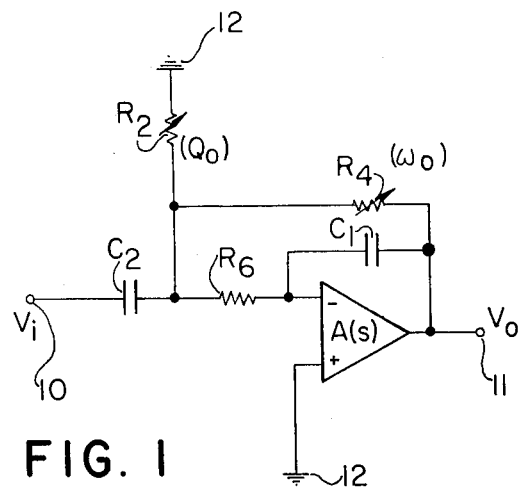
FIG. 1 is a schematic circuit diagram of a functionally tunable RC-active band-pass filter.

In the embodiments illustrated in the accompanying drawings, the passive components are designated by reference characters, the relative values of which will be such as to satisfy the equations found in the following technical description.

Figure 2:
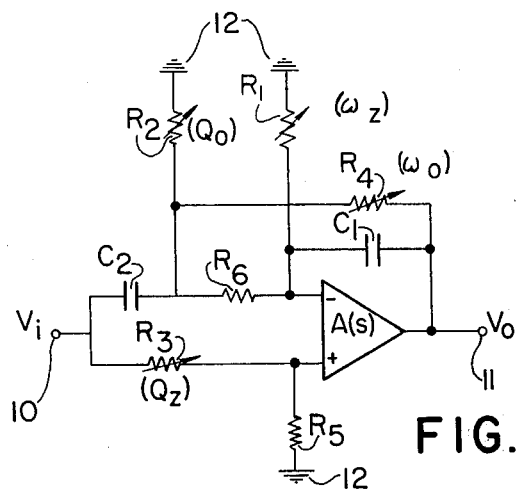
FIG. 2 is a modified form of the schematic circuit diagram illustrated in FIG. 1 which includes additional elements to realize a low-pass notch filter.
Figure 3:
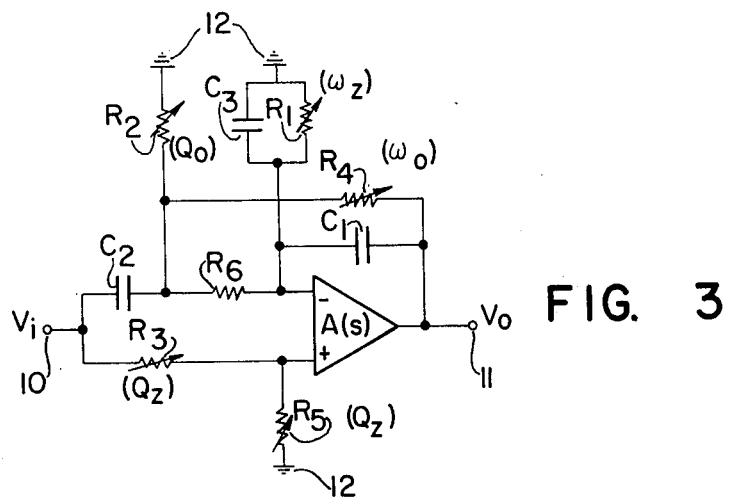
FIG. 3 is a modified form of the schematic circuit diagram illustrated in FIG. 2 which includes an additional element to realize with selected element values a high-pass notch filter, an all-pass filter or a band-stop filter.
Figure 4A:
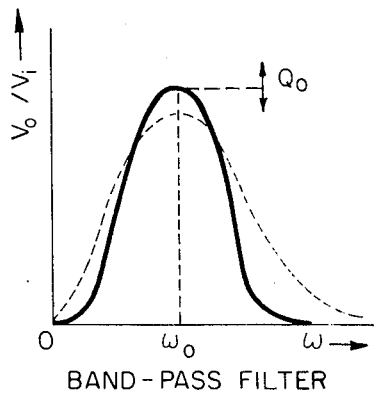
FIGS. 4A, 4B, 4C, 4D and 4E illustrate the effect that the functional parameters have on the response characteristics of the family of filters shown in FIGS. 1, 2 and 3.
Figure 4B:
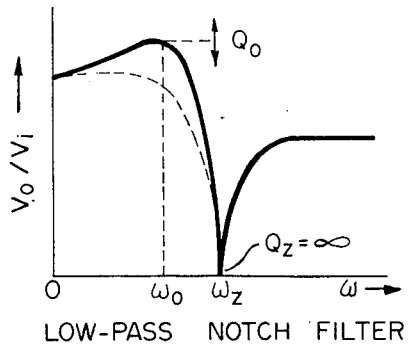
Figure 4C:
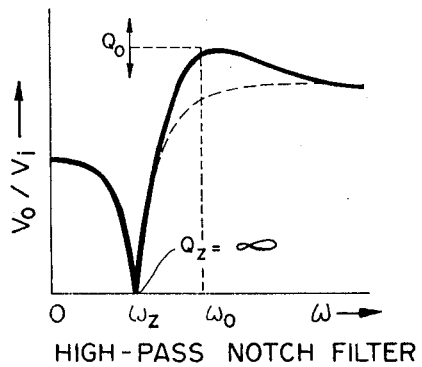
Figure 4D:
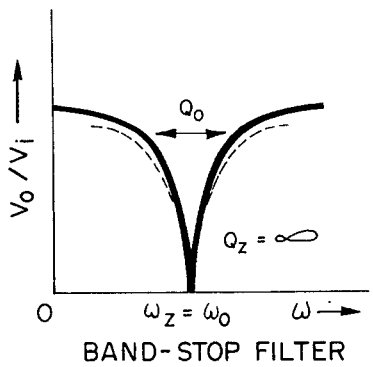
Figure 4E:
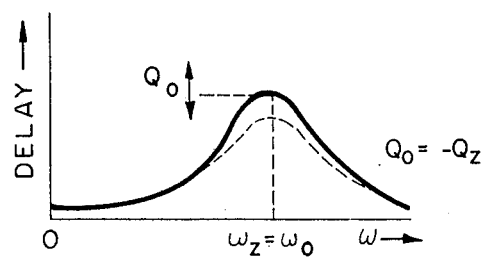

Referring to FIGS. 1 to 3, each of the functionally tunable active filters comprises: an input terminal 10 for connecting an input signal $V_i$ thereto, an output terminal 11 for connecting an output signal $V_o$ therefrom, and a common or ground terminal 12. In addition the filters include a single differential-input operational amplifier A(s) having its output connected to the output terminal 11. A first capacitor $C_2$ and a first resistor $R_6$ are connected in series between the input terminal 10 and the inverting input (-) of the differential amplifier A(s). In addition, a second capacitor $C_1$ is connected between the inverting input and the output of the differential amplifier A(s). Each of the circuits also includes a second resistor $R_2$ which is connected between the junction of the first capacitor $C_2$ and resistor $R_6$, and the common terminal 12. A third resistor $R_4$ is connected between this junction and the output of the differential amplifier A(s). In addition, each of the filters includes a conductive element which is connected between the non-inverting input (+) of the differential amplifier A(s) and the common terminal 12.

In FIG. 1, this conductive element is a direct connection between the non-inverting input and the common terminal 12; while in FIGS. 2 and 3 it is a fourth resistor $R_5$.

In addition to those elements illustrated in FIG. 1, the embodiments of FIGS. 2 and 3 also include a fifth resistor $R_3$ connected between the non-inverting input of the differential amplifier A(s) and the input terminal 10; and a sixth resistor $R_1$ connected between the inverting input of the differential amplifier A(s) and the common terminal 12. While in addition to those elements illustrated in FIG. 2, the embodiment of FIG. 3 also includes a third capacitor $C_3$ connected in shunt with the resistor $R_1$.

As is manifest hereinafter, the three circuits illustrate a family of functionally tunable RC-active filters which realize a band-pass filter in FIG. 1, a low-pass notch filter in FIG. 2, and depending upon the element values, a high-pass notch filter, an all-pass filter or a band-stop filter in FIG. 3.

FILTER REALIZATION

The voltage transfer function of a general biquadratic filter has the form:

$$T(s) = G \frac{s^2 + s \frac{\omega_z}{Q_z} + \omega_z^2}{s^2 + s \frac{\omega_o}{Q_o} + \omega_o^2} \quad (1)$$

where:  $G$ = gain level constant   $s$ = complex frequency variable
$\omega_o$ = pole resonant frequency   $Q_o$ = pole quality factor
$\omega_z$ = zero resonant frequency   $Q_z$ = zero quality factor Unidirectional functional tuning of such a filter can be achieved through resistive trimming, if the term containing the pole quality factor $\omega_o/Q_o$ is dependent upon a resistor value that does not affect the pole resonant frequency term $\omega_o^2$; the zero resonant frequency term $\omega_z^2$ is dependent upon a resistor value that does not affect either $\omega_o^2$ or $\omega_o/Q_o$; and finally, the term containing the zero quality factor $\omega_z/Q_z$ is dependent upon a resistor value that does not affect any of the other terms $\omega_o^2$, $\omega_o/Q_o$ or $\omega_z^2$.

If the differential amplifier is ideal, i.e. $A(s) \to \infty$, then the voltage transfer function of the circuit illustrated in FIG. 3 has the form:

$$T(s) = \frac{C_1+C_3}{C_1} k \frac{s^2 + s\left[\frac{1}{R_6C_2} + \frac{1}{R_{24}C_2} + \frac{1}{R_1(C_1+C_3)} - \frac{1}{R_6(C_1+C_3)} \cdot \frac{R_3}{R_5}\right] + \frac{R_1+R_{24}+R_6}{R_1R_{24}R_6C_2(C_1+C_3)}}{s^2 + s\left(\frac{1}{R_6C_2} + \frac{1}{R_{24}C_2}\right) + \frac{1}{R_4R_6C_1C_2}} \quad (2)$$

where:  $k = \frac{R_5}{R_3 + R_5}$     $R_{24} = \frac{R_2 R_4}{R_2 + R_4}$

Comparing equations (1) and (2), it can be seen that:

$$G = \frac{C_1 + C_3}{C_1} k \quad (3)$$

$$\omega_o^2 = \frac{1}{R_4R_6C_1C_2} \quad (4)$$

$$\frac{\omega_o}{Q_o} = \frac{1}{R_6C_2} + \frac{1}{R_{24}C_2} \quad (5)$$

$$\omega_z^2 = \frac{R_1 + R_{24} + R_6}{R_1R_{24}R_6C_2(C_1 + C_3)} \quad (6)$$

$$\frac{\omega_z}{Q_z} = \frac{1}{R_6C_2} + \frac{1}{R_{24}C_2} + \frac{1}{R_1(C_1 + C_3)} - \frac{1}{R_6(C_1 + C_3)} \cdot \frac{R_3}{R_5} \quad (7)$$

From the above set of equations, it is evident that:

$\omega_o = f(R_4, R_6)$     $\omega_z = f(R_1, R_2, R_4, R_6)$
$Q_o = f(R_2, R_4, R_6)$     $Q_z = f(R_1, R_2, R_3, R_4, R_5, R_6)$ Consequently, a unidirectional sequence of functional tuning of the filters can be achieved if the tuning operation is performed in the following sequence:

1) $\omega_o$ is adjusted by $R_4$ or $R_6$
2) $Q_o$ is adjusted by $R_2$
3) $\omega_z$ is adjusted by $R_1$
4) $Q_z$ is adjusted by $R_3$ or $R_5$ If the capacitor $C_3 = 0$ as in FIG. 2, the transfer function (2) reduces to:

$$T(s) = k \frac{s^2 + s\left[\dfrac{1}{R_6 C_2} + \dfrac{1}{R_{24} C_2} + \dfrac{1}{R_1 C_1} - \dfrac{1}{R_6 C_1}\dfrac{R_3}{R_5}\right] + \dfrac{R_1 + R_{24} + R_6}{R_1 R_{24} R_6 C_1 C_2}}{s^2 + s\left(\dfrac{1}{R_6 C_2} + \dfrac{1}{R_{24} C_2}\right) + \dfrac{1}{R_4 R_6 C_1 C_2}} \quad (2A)$$

This results in corresponding changes to equations (3), (6) and (7) as follows:

$$G = k \quad (3A)$$

$$\omega_z^2 = \frac{R_1 + R_{24} + R_6}{R_1 R_{24} R_6 C_1 C_2} \quad (6A)$$

$$\frac{\omega_z}{Q_z} = \frac{1}{R_6 C_2} + \frac{1}{R_{24} C_2} + \frac{1}{R_1 C_1} - \frac{1}{R_6 C_1}\frac{R_3}{R_5} \quad (7A)$$

However, it is evident that the unidirectional sequence of functional tuning will be the same as that for the circuit of FIG. 3.

Similarly, if the resistors $R_3 = \infty$ and $R_5 = 0$ as in FIG. 1, the transfer function (2) now reduces to:

$$T(s) = \frac{-s\left[\dfrac{1}{R_6 C_1}\right]}{s^2 + s\left(\dfrac{1}{R_6 C_2} + \dfrac{1}{R_{24} C_2}\right) + \dfrac{1}{R_4 R_6 C_1 C_2}} \quad (2B)$$

Under such circumstances the zero resonant frequency term $\omega_z^2 = 0$ or $\infty$, and the term including the zero quality factor $\omega_z/Q_z$ no longer has any significance. Unidirectional functional tuning is then achieved simply by adjusting for $\omega_o$ and $Q_o$ as designated above. It will be noted that resistor $R_1$ does not appear in equation (2B). It can be shown that the circuit will function with or without this resistor $R_1$ and consequently it can be eliminated.

Each subsequent resistor trimming does not affect the previously adjusted parameters. Thus, in the ideal case, unidirectional trimming of the tuning resistors and consequently complete functional tuning is possible for a filter structure which would satisfy the transfer function of equation (2). Hence the invention is in the realization of a practical structure which would meet this requirement.

The network of FIG. 3 contains nine passive elements of which one in both the inverting and noninverting input arms is available to determine the arbitrary impedance level. Four others are available to satisfy the relationships found in equations (4) to (7). Hence, in order to completely determine the design values of the filter elements, 3° of freedom are available. Similarly, the network of FIG. 2 has eight passive elements, of which two determine the arbitrary impedance level and four more satisfy the relationships of equations (4) (5) (6A) and (7A), thus leaving 2° of freedom. In FIG. 1, the components in the noninverting input arm and resistor $R_1$ in the inverting arm are eliminated. Consequently, only one element in the inverting input arm is utilized to determine the arbitrary impedance level. With only two passive elements required to satisfy the relationships of equations (4) and (5) and a total of five available, 2° of freedom are available to completely determine the design values of the filter elements. The above equations assume an ideal operational amplifier $A(s)$. It will be evident that in a practical realization of such a filter the characteristics of the operational amplifier $A(s)$ must also be taken into account, as is well known to those skilled in the art.

Depending upon the component values, the circuit illustrated in FIG. 3 will function as either a high-pass notch filter, an all-pass filter (delay equalizer) or a band-stop filter; the circuit illustrated in FIG. 2 wll function as a low-pass notch filter; and the circuit illustrated in FIG. 1 will function as a band-pass filter. This can be better understood with reference to FIGS. 4A to 4E which illustrate the effect that the various functional parameters have on the characteristics of the different filters.

FILTER TUNING PROCEDURE

The basic tuning procedure is similar for all five filters of the family. In order to obtain unidirectional functional tuning, the functional parameters are tuned in the following sequence: $\omega_o$, $Q_o$, $\omega_z$ and $Q_z$. The drawings also indicate in parenthesis the particular functional parameters which are adjusted by trimming each of the resistors. The following procedure is based mainly on phase measurements. In practice, a slight phase error is introduced due to the non-ideal characteristics of the operational amplifier $A(s)$. Normally, this error is much less than 1° and has therefore been ignored in the following tuning procedure.

1. When resistor $R_5$ is shorted, the transfer function of equation (2) reduces to a band-pass characteristic and the transmission poles remain unchanged. With the resistor $R_5$ shorted, a signal is fed to the input terminal 10 of the filter at the required pole resonant frequency $\omega_o$. The resistor $R_4$ is then varied to adjust the phase difference between the output, terminal 11, and the input, terminal 10, to: $\theta(\omega_o) = 180°$.

2. It can be determined that the frequencies $\omega_1$ or $\omega_2$ at which the phase is most sensitive to variations in $Q_o$ occurs when:

$$\omega_1, \text{ or } \omega_2 = \frac{\omega_o}{2Q_o}\left[\sqrt{1 + 4Q_o^2} \pm 1\right]$$

The phases corresponding to the two frequencies are $180° \pm 45°$ resulting in $\theta_1 = 135°$ and $\theta_2 = 225°$. For minimum error it is recommended that the lower frequency $\omega_2$ be used. With resistor $R_5$ still shorted, a second signal is coupled to the input terminal 10 of the filter at a frequency $\omega_2$ and the phase difference at the output terminal 11 compared to the input terminal 10 is adjusted to the value of $\theta_2$ above, using resistor $R_2$. As a check, if the signal is then varied to $\omega_1$, the phase difference between the output and input of the filter should now be $\omega_1$ defined above. This now conpletes adjustment of the transmission poles.

ALL-PASS FILTER

It can be shown that the phase $\theta_3$ is most sensitive to variations in $\omega_z$ at the frequency $\omega_3 = \omega_z$. Assuming that all the trimming resistors are initially much lower than their nominal values and are being increased during the tuning process, which is the case in thin and thick film technologies, then slightly different steps described below can be followed to adjust the zeros. For the case of the all-pass network of FIG. 3, the resistor $R_5$ is fixed and the resistor $R_3$ is selected as the trimming resistor. Then:

3. Remove the short circuit across the resistor $R_5$ and apply a signal to the input terminal 10 of the filter at the required zero frequency ($\omega_z = \omega_o$). Here, the quantity $\omega_z^2$ is higher than its nominal value and the quantity ($\omega_z/Q_z$) can be made initially positive. The resistor $R_3$ can then be increased until there is minimum voltage at the output terminal 11 or $\theta_3 = -90°$. At this point, $\omega_z/Q_z = 0$, i.e. $Q_z$ is very high.

4. Resistor $R_1$ can now be increased to adjust the quantity $\omega_z^2$. this trimming will make the quantity $\omega_z/Q_z$ negative. Exact adjustment will be reached when: $\theta(\omega_z = \omega_o) = +180°$.

5. Monitoring the voltage at the output terminal 11 at two different frequencies, e.g. $\omega_o$ and 0.1 $\omega_o$, the resistor $R_3$ is increased until there is no variation in this voltage level. Although during this adjustment the constant multiplier varies, practically this poses no problem. In this final adjustment step for $Q_z$, the phase measured at $\omega_o$ remains unchanged at the value indicated in step 4.

HIGH-PASS NOTCH FILTER

For the case of high-pass notch filter of FIG. 3, resistor $R_3$ is fixed and $R_5$ is the variable trimming resistor, then:

3a. The short circuit is removed from $R_5$ and a signal is fed to the filter at the required zero frequency $\omega_z$. At this point the quantity $\omega_z^2$ is higher than its nominal value and the quantity ($\omega_z/Q_z$) can be made initially negative. $R_5$ can then be increased until either minimum gain at the output voltage or the phase difference between output 11 and input 10 is:

$$\theta = -\tan^{-1} \frac{\frac{\omega_z \omega_o}{Q_o}}{\omega_o^2 - \omega_z^2}$$

is attained. This corresponds to very high value of $Q_z$.

4b. The adjustment of $\omega_z^2$ can now be performed through trimming of $R_1$. As $R_1$ is increased, the quantity ($\omega_z/Q_z$) becomes negative and the exact adjustment will be reached when the phase difference is $$\theta(\omega_z) = -90° - \tan^{-1} \frac{\frac{\omega_z \omega_o}{Q_o}}{\omega_o^2 - \omega_z^2}$$

5a. At the same zero frequency $\omega_z$, the final adjustment for $Q_z$ can now be made. Monitoring the output voltage level, resistor $R_5$ is increased until maximum attenuation through the filter is reached.

BAND-STOP FILTER

The tuning procedure for the band-stop filter of FIG. 3 is identical with that of the high-pass notch except that the two frequencies $\omega_z$ and $\omega_o$ coincide, $\omega_z = \omega_o$.

LOW-PASS NOTCH FILTER

The tuning procedure for the low-pass notch filter of FIG. 2 is again basically the same as that for the high-pass notch filter except that the zero resonant frequency is greater than rather than less than the pole resonant frequency, $\omega_z > \omega_o$.

BAND-PASS FILTER

In FIG. 1, the noninverting input of the operational amplifier A(s) is connected to ground. Since this is equivalent to short-circuiting resistor $R_5$, the tuning procedure for the band-pass filter is identical to the first two steps detailed above. The tuning of the transmission poles completes the adjustment of this filter.

The following are non-limiting examples of two of the filters illustrating typical characteristics which can be achieved:

EXAMPLE I: HIGH-PASS NOTCH FILTER

An exemplary filter which would meet the following specifications: attenuation >20 dB for 40 Hz < f < 70 Hz; ripple <0.05 dB for 300 Hz < f < 3.0 KHz has the following characteristics:

$Q_o = 0.832;$  $\quad \frac{\omega_z^2}{\omega_o^2} = 0.1778$  $\quad$ and $\quad f_z = 57.1\ Hz$ Typical component values which would meet the above criteria are:

| | | | |
|---|---|---|---|
| $C_1 =$ | 21 nF | $R_3 =$ | 10.0 KΩ |
| $C_2 =$ | 71.5 nF | $R_4 =$ | 33.6 KΩ |
| $C_3 =$ | 169 nF | $R_5 =$ | 1.83 KΩ |
| $R_1 =$ | 179 KΩ | $R_6 =$ | 27.5 KΩ |
| $R_2 =$ | 144 KΩ | A(s) | $A_o = 10^5$ & $f_t = 800$ KHz |

EXAMPLE II: ALL-PASS DELAY EQUALIZER NETWORK

A typical all-pass filter has the parameters: $Q_o = 5.07$, $f_o = 2360$ Hz to meet the requirements of a magnitude response which is flat within ±0.01 dB over the frequency range 100 Hz < f < 5 KHz.

Typical component values which would meet the above criteria are:

| | | | |
|---|---|---|---|
| $C_1 =$ 150 pF | | $R_3 =$ 2.79 KΩ | |
| $C_2 =$ 20 nF | | $R_4 =$ 42.2 KΩ | |
| $C_3 =$ 150 pF | | $R_5 =$ 10.0 KΩ | |
| $R_1 =$ 157 KΩ | | $R_6 =$ 34.2 KΩ | |
| $R_2 =$ 121 KΩ | | A(s)  $A_o = 10^5$ & $f_t = 800$ KHz | |

In summary, the present invention provides a completely functionally tunable, single amplifier, general biquadratic active filter. In the cases of high-pass notch, all-pass and band-stop characteristics, three capacitors are needed, but the network reduces to canonical form for the low-pass notch and band-pass cases. Each filter has low passive sensitivities, however due to their active sensitivity and capacitance value spread, they are mainly suitable for moderate-Q applications.

A five step tuning process is described based mainly on phase adjustments, with the notch condition adjusted through magnitude measurements. The resistor trimming operation is unidirectional, which is suitable for thin and thick film technologies.

What is claimed is:

1. An RC functionally tunable active filter comprising:

input, output and common terminals;

a differential amplifier having inverting and noninverting inputs, and an output connected to the output terminal;

a first capacitor and a first resistor serially connected between the input terminal and the inverting input of the differential amplifier;

a second capacitor connected between the inverting input and the output of the differential amplifier;

a second resistor connected between the junction of the first capacitor and resistor, and the common terminal;

a third resistor connected between said junction and the output of the differential amplifier; and conductive means connected between the noninverting input of the differential amplifier and the common terminal;

the differential amplifier, resistors, capacitors and conductive means coacting such that variations in resistance of the first and/or third resistors affect the pole resonant frequency $\omega_o$; and variations in resistance of the second resistor affect the pole quality factor $Q_o$ but not $\omega_o$, thereby enabling a unidirectional sequence of functional tuning of the filter.

2. An RC functionally tunable active filter as defined in claim 1 in which the conductive means is a direct connection between the noninverting input of the differential amplifier and the common terminal; and the differential amplifier, resistors and capacitors coact as a band-pass filter.

3. An RC functionally tunable active filter as defined in claim 1 in which:

the conductive means comprises a fourth resistor connected between the noninverting input of the differential amplifier and the common terminal; and which additionally comprises:

a fifth resistor connected between the noninverting input of the differential amplifier and the input terminal; and a sixth resistor connected between the inverting input of the differential amplifier and the common terminal;

the differential amplifier, resistors and capacitors coacting as a low-pass notch filter such that variations in resistance of the sixth resistor affect the zero resonant frequency $\omega_z$ but not $\omega_o$ and $Q_o$, and variations in resistance of the fourth and/or fifth resistors affect the zero quality factor $Q_z$ but not $\omega_o$, $\omega_z$ and $Q_o$, thereby enabling a unidirectional sequence of functional tuning of the filter.

4. An RC functionally tunable active filter as defined in claim 1 in which:

the conductive means comprises a fourth resistor connected between the noninverting input of the differential amplifier and the common terminal; and which additionally comprises:

a fifth resistor connected between the noninverting input of the differential amplifier and the input terminal; and a sixth resistor and a third capacitor connected in shunt between the inverting input of the differential amplifier and the common terminal;

the differential amplifier, resistors and capacitors coacting as either a high-pass notch filter, a band-stop filter or an all-pass filter such that variations in resistance of the sixth resistor affect the zero resonant frequency $\omega_z$ but not $\omega_o$ and $Q_o$, and variations in resistance of the fourth and/or fifth resistors affect the zero quality factor $Q_z$ but not $\omega_o$, $\omega_z$ and $Q_o$, thereby enabling a unidirectional sequence of functional tuning of the filter.

5. An RC functionally tunable active filter comprising:

input, output and common terminals;

a differential amplifier having inverting and noninverting inputs, and an output connected to the output terminal of the filter;

a first capacitor and a first resistor serially connected between the input terminal and the inverting input of the differential amplifier;

a second capacitor connected between the inverting input and the output of the differential amplifier;

a second resistor connected between the junction of the first capacitor and resistor, and the common terminal;

a third resistor connected between said junction and the output of the differential amplifier; and the noninverting input of the differential amplifier being connected to the common terminal;

the differential amplifier, resistors and capacitors coacting such that variations of the resistance of the first and/or third resistors affect the pole resonant frequency $\omega_o$, and variations in resistance of the second resistor affect the pole quality factor $Q_o$ but not $\omega_o$; and the values of the resistors and capacitors are such that: $\omega_z = 0$, whereby the filter functions as a band-pass filter.

6. An RC functionally tunable active filter comprising:

input, output and common terminals;

a differential amplifier having inverting and noninverting inputs, and an output connected to the output terminal of the filter;

a first capacitor and a first resistor serially connected between the input terminal and the inverting input of the differential amplifier;

a second capacitor connected between the inverting input and the output of the dfferential amplifier;

a second resistor connected between the junction of the first capacitor and resistor, and the common terminal;

a third resistor connected between said junction and the output of the differential amplifier;

a fourth resistor connected between the noninverting input of the differential amplifier and the common terminal;

a fifth resistor connected between the input terminal and the noninverting input of the differential amplifier; and a sixth resistor connected between the inverting input of the differential amplifier and the common terminal;

the differential amplifier, resistors and capacitors coacting such that variations in the resistance of the first and/or third resistors affect the pole resonant frequency $\omega_o$, variations in resistance of the second resistor affect the pole quality factor $Q_o$ but not $\omega_o$, variations in resistance of the sixth resistor affect the zero resonant frequency $\omega_z$ but not $\omega_o$ and $Q_o$, and variations in resistance of the fourth and/or fifth resistors affect the zero quality factor $Q_z$ but not $\omega_o$, $\omega_z$ and $Q_o$; and the values of the resistors and capacitors are such that: $\omega_z > \omega_o$, and $Q_z = \infty$, whereby the filter functions as a low-pass notch filter.

7. An RC functionally tunable active filter comprising:

input, output and common terminals;

a differential amplifier having inverting and noninverting inputs, and an output connected to the output terminal of the filter;

a first capacitor and a first resistor serially connected between the input terminal and the inverting input of the differential amplifier;

a second capacitor connected between the inverting input and the output of the differential amplifier;

a second resistor connected between the junction of the first capacitor and resistor, and the common terminal;

a third resistor connected between said junction and the output of the differential amplifier;

a fourth resistor connected between the noninverting input of the differential amplifier and the common terminal;

a fifth resistor connected between the input terminal and the noninverting input of the differential amplifier; and a sixth resistor and a third capacitor connected in shunt between the inverting input of the differential amplifier and the common terminal;

the differential amplifier, resistors and capacitors coacting such that variations in the resistance of the first and/or third resistors affect the pole resonant frequency $\omega_o$, variations in resistance of the second resistor affect the pole quality factor $Q_o$ but not $\omega_o$, variations in resistance of the sixth resistor affect the zero resonant frequency $\omega_z$ but not $\omega_o$ and $Q_o$, and variations in resistance of the fourth and/or fifth resistors affect the zero quality factor $Q_z$ but not $\omega_o$, $\omega_z$ and $Q_o$.

8. An RC functionally tunable active filter as defined in claim 7 in which the values of the resistors and capacitors are such that: $\omega_z < \omega_o$, and $Q_z = \infty$, whereby the filter functions as a high-pass notch filter.

9. An RC functionally tunable active filter as defined in claim 7 in which:

the values of the resistors and capacitors are such that: $\omega_z = \omega_o$, and $Q_z = -Q_o$, whereby the filter functions as an all-pass filter.

10. An RC functionally tunable active filter as defined in claim 7 in which the values of the resistors and capacitors are such that: $\omega_z = \omega_o$, and $Q_z = \infty$, whereby the filter functions as a band-stop filter.

* * * * *